United States Patent [19]

Kohler et al.

[11] Patent Number: 5,893,409
[45] Date of Patent: Apr. 13, 1999

[54] COOLING ELEMENT FOR ELECTRONIC COMPONENTS

[75] Inventors: Gerd Kohler, München; Tobias Kirmse, Östringen; Klaus-Werner Köhler, Speyer; Hans-Uwe Luckner, Regensburg, all of Germany

[73] Assignee: Siemens Aktiengesellschaft, Munich, Germany

[21] Appl. No.: 09/029,173

[22] PCT Filed: Aug. 6, 1996

[86] PCT No.: PCT/DE96/01469

§ 371 Date: Feb. 27, 1998

§ 102(e) Date: Feb. 27, 1998

[87] PCT Pub. No.: WO97/08750

PCT Pub. Date: Mar. 6, 1997

[30] Foreign Application Priority Data

Aug. 28, 1995 [DE] Germany .................. 195 31 628

[51] Int. Cl.$^6$ .................. F28F 7/00; H01L 23/36
[52] U.S. Cl. .................. 165/80.3; 165/185; 174/16.3; 257/718; 257/719; 361/704
[58] Field of Search .................. 165/80.3, 185; 174/16.3; 257/718, 719, 722; 361/690, 703, 704

[56] References Cited

U.S. PATENT DOCUMENTS

| 3,670,215 | 6/1972 | Wilkins et al. | 257/718 |
| 4,605,058 | 8/1986 | Wilens | 257/718 X |
| 4,945,401 | 7/1990 | Trunk et al. | 257/718 |

FOREIGN PATENT DOCUMENTS

| 2425723 | 12/1975 | Germany | 174/16.3 |
| 10558 | 1/1992 | Japan | 257/722 |

Primary Examiner—Leonard R. Leo
Attorney, Agent, or Firm—Hill & Simpson

[57] ABSTRACT

A heat sink for electronic components is presented, which is integral and comprises a strip of sheet brass. This strip is bent in a meandering shape, contact surfaces being seated on a heat distributor of a component, in the region of lower meandering curves. The heat sink is held firmly on the component by means of an internally produced prestress in conjunction with a snap-action connection. Although the heat sink has longitudinal elasticity even in the fitted state, its heat-dissipating function can always be maintained.

8 Claims, 2 Drawing Sheets

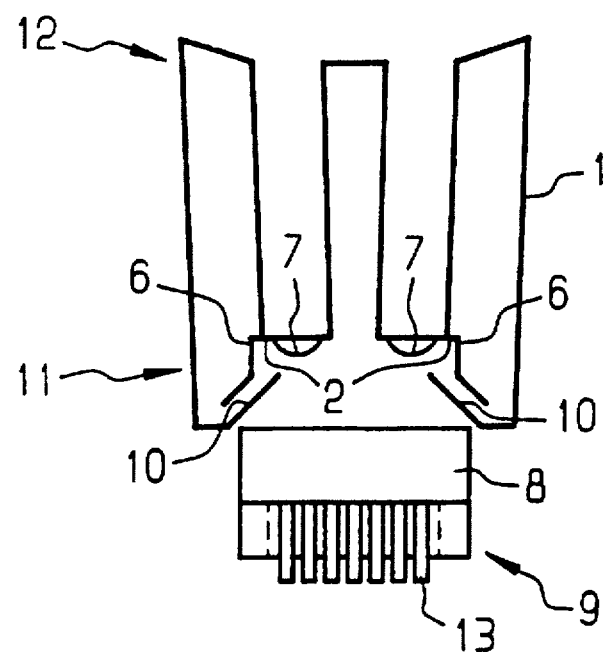
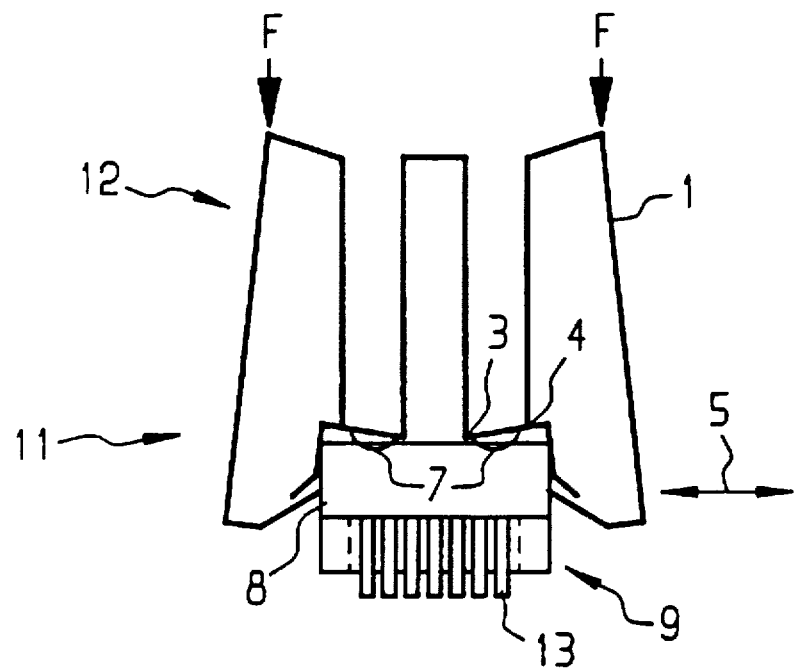

COOLING ELEMENT FOR ELECTRONIC COMPONENTS

FIELD OF THE INVENTION

The invention relates to a heat sink for electronic components, in particular to a heat sink which can be mounted on and coupled to the top of a component which, absorbs the heat losses from the component, and which emits them via cooling surfaces. As a rule, such a heat sink is in contact with a heat distributor (or heat slug) of the component.

Good heat dissipation is essential to reliable use of semiconductor components. The requirement for heat sinks with ever greater performance arises as the power density increases and components become ever smaller, with the increasing power loss resulting from this. These heat sinks should have good thermal conductivity for internal heat conduction, and should have a large surface area for external dissipation of the heat. In this case, the power loss is initially transmitted from the semiconductor casing via contact surfaces to the heat sink. The heat distribution within the heat sink takes place by thermal conduction. The external emission of the heat takes place by means of radiation and/or convection.

As the surfaces to be cooled become smaller while the power loss to be dissipated at the same time becomes higher, irregularities in the surfaces to be cooled have an increasingly unfavourable effect on the heat transmission from the component to the heat sink. These irregularities can be compensated for by the use of heat conducting foils. However, this means an increased cost for material and handling costs.

A very wide range of designs of heat sinks is known in the prior art. For example, German Laid-Open Specification DE 43 35 299 proposes a heat sink for connection to a semiconductor casing, in which two opposite sides can be connected to a housing, like brackets. The heat sink has cooling ribs and a contact surface which, for heat transmission, are in contact with electronic component, in particular with its top.

Other forms of heat sinks are known, for example, from the German Laid-Open Specification DE 24 25 723 or from the Japanese Patent Application No. 64-23 11 04.

The solutions which have been proposed in the prior art have the disadvantages that they occupy too much space, are too complicated and are thus too expensive or too unreliable, so that the cooling effect breaks down or fails, for example, in the event of vibration.

SUMMARY OF THE INVENTION

The invention is based on the object of providing a cost-effective, self-centring heat sink which is fixed well, is nevertheless flexible and has a high heat dissipation capability.

The invention is based on the knowledge that the optimum position of contact surfaces of the heat sink on the heat distributor of an electronic component can be obtained after the action of forces by means of a spring structure of a heat sink, which structure is bent in a meandering or intricate shape from a sheet-metal strip, since the heat sink is subject to prestressing. Furthermore, shoulders and lugs in the region of the contact surfaces of the heat sink ensure effective centring and positioning relative to the component. Although the heat sink is thus elastic and can absorb certain mechanical stresses, it assumes its original position again, however, so that reliable heat dissipation is ensured at all times. The surface area required by a heat sink in plan view is only slightly larger than the surface area of the component to be cooled. The heat sink may be built to any desired height in order to match the performance to the heat dissipation. The solution according to the invention, that the heat sink is produced by a stamped/bent part from a sheet-metal strip and is bent in an intricate shape, offers the opportunity of placing appropriate contact surfaces accurately in position on the component, and of producing a prestress which acts by means of appropriate bends, so that a snap-action connection draws the heat sink with its cooling surfaces onto the component, and that the shoulders and lugs which are used for centring are constructed integrally on the strip, that is to say they are stamped and bent in a corresponding manner.

In an embodiment, the heat sink of the present invention includes a body formed from a metal strip, preferably a brass metal strip. The body includes a lower portion and an upper portion. The lower portion includes at least one contact surface for making at least partial contact with the heat distributor of an electrical component. The contact surface is disposed between at least two laterally spaced apart shoulders disposed on opposing sides of the lower portion. The two laterally spaced shoulders define a lateral space for accommodating the width of the heat distributor of the electrical component. The lower portion also includes at least two longitudinally spaced apart lugs disposed on opposing ends of the lower portion of the body. The spacing of the lugs defines a longitudinal space for accommodating the length of the heat distributor. The lower portion of the heat sink also includes two laterally spaced apart tabs. Each tab being disposed on an opposing side of the lower portion and vertically below the shoulders. Each tab includes an upwardly and inwardly directed finger that is biased in an inwardly direction. The fingers slide down over the top of the heat distributor and engage the underside of the heat distributor when the heat sink is fully mounted onto the electrical component. The heat sink also includes an upper portion which includes at least two laterally spaced fins. The fins are biased towards a relaxed position but are resiliently movable towards each other which results in a spreading apart of the shoulders of the lower portion to facilitate a mounting of the lower portion of the heat sink onto the heat distributor of the electrical component and further which facilitates the pushing downward of the fingers of the tabs over the heat distributor so that the tabs can lock onto the underside of the heat distributor in a snap-fit sequence.

In an embodiment, the lower portion includes four shoulders, two shoulders on each side of the lower portion.

In an embodiment, the lower portion includes four lugs, two lugs disposed at each end of the lower portion.

In an embodiment, the upper portion includes three fins, including two laterally spaced fins with a middle fin disposed therebetween.

Other objects and advantages of the present invention will become apparent after reading the detailed description and appended claims, and upon reference to the accompanying drawings.

BRIEF DESCRIPTION OF THE DRAWINGS

An exemplary embodiment is described in the following text, with reference to the schematic FIGS. 1 to 5.

FIGS. 1 to 3 illustrate the principle of heat sink mounting. In this case, the heat sink according to FIG. 1 is in the rest condition, that according to FIG. 2 is in the condition where it is fitted but is not yet completely mounted, and that corresponding to FIG. 3 is in the completely mounted state.

3

Figure 4:
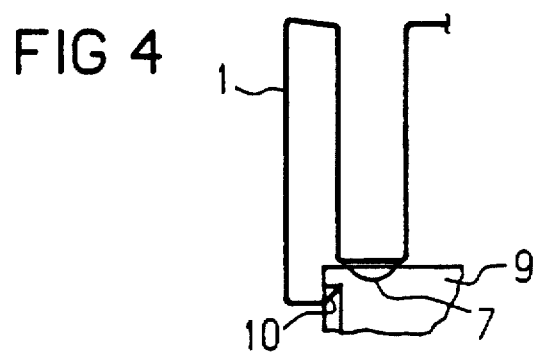

FIG. 4 illustrates a detailed illustration of the snap-in connection, which is provided on both sides of the component, between the heat sink and the component.

Figure 5:
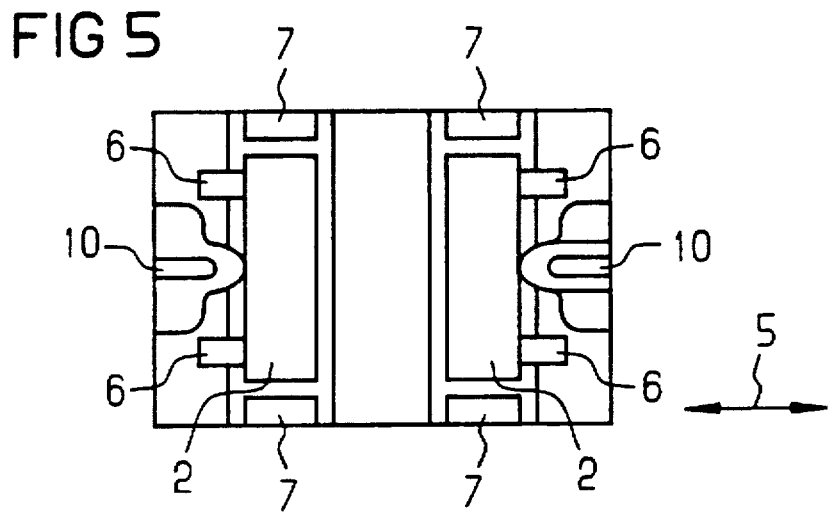

FIG. 5 illustrates the view of the heat sink from below, concealed parts such as contact surfaces or tabs also being included.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

Figure 3:
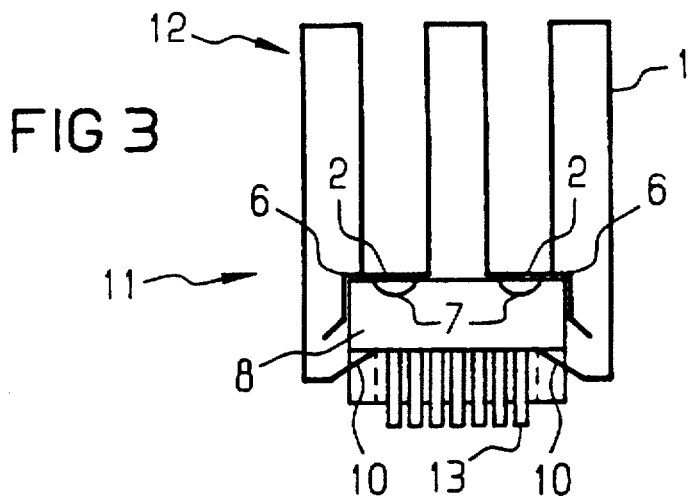

FIGS. 1 to 3 each show a side view of an electronic component 9 with corresponding electrical connections 13 and together with a heat sink 1 which is located above it. The electronic component 9 has a socalled heat distributor (heat slug). This can be provided on the top of the component 9, over the whole area, partially or else in edge regions, that is to say on the side surfaces of the component 9, and contact can be made with it from the outside. The heat sink 1 is produced integrally with all the elements which are visible in FIGS. 1 to 3. The contours of shoulders 6, lugs 7 and tabs 10 are stamped out in a brass sheet-metal strip for this purpose. The heat sink 1 is given the illustrated intricate shape during bending. The shoulders 6 and lugs 7 are bent in a corresponding manner to the upper outline of the heat distributor 8 in such a manner that they are used for centering and positioning relative to the heat distributor 8. For self-centering when the heat sink 1 is placed onto a component, the shoulders 6 are bent outwards at their ends, corresponding to the shape of a funnel. The lugs 7 bound the side position region of the heat sink 1 on the component 9. In order to assist assembly, the distance between the lugs 7 is greater than the corresponding width of the component 9.

In FIG. 1, the heat sink 1 has not yet been placed on the component 9. In this embodiment, the lower meandering curves 11 contain the contact surfaces 2 which are intended to be seated on the heat distributor 8. The intricate shape is in this case illustrated by bends which are in the region of 90°. As is illustrated in FIG. 1, the outer fen of the upper curved portion 12 meandering bends are constructed in order to ensure that the introduction of the joining forces F is ensured in a simple manner during assembly.

The stress which remains in the heat sink 1 after the production of the snap-action connection between the heat sink 1 and the component 9 produces secure retention and contact pressure of the contact surfaces 2 on the heat distributor 8.

As a result of the relationships which are described above and are produced by appropriate bends, the heat sink 1 can be placed onto the component or onto the heat distributor 8 by means of the joining forces F, which act vertically from above. In this case, the contact surfaces 2 are initially placed partially or completely on the top of the component. The heat sink 1 is centered and positioned relative to the component 9 by means of the shoulders 6. After being pressed inwards for mounting, the two outer limbs or fens of upper curved portion 12 of the heat sink 1 are pressed outwards by the action of the fingers of the tabs 10, which are guided inwards and upwards. The heat sink 1 is not yet completely mounted in the condition corresponding to FIG. 2.

4

FIG. 3 shows a system with a heat sink 1 which is completely mounted on a component 9. The contact surfaces 2 are completely seated on the top of the component 9. The shoulders 6 rest against the edge of the upper part of the component 9. The heat sink 1 is locked the tabs 10 latching, for example, into a cutout in the component 9 or in the heat distributor 8. However, it remains subject to prestressing. The contact surfaces are thus reliably pressed onto the heat distributor 8.

FIG. 4 shows how a tab 10 engages, for example, in a cutout in the electronic component 9.

FIG. 5 shows a view of the heat sink from underneath. The ends of the shoulders 6, which are bent outwards, can be seen, as can the lugs 7. The contact surfaces 2 appear in their outlines as rectangles. The longitudinal direction 5 of the heat sink 1 is indicated by a double arrow. The width of the sheet-metal brass strip results approximately from the width of the component 9, the distance between the component and the lugs 7 in each case, and twice the width of the lugs 7.

The structural design in an intricate shape results in the heat sink 1 having the necessary longitudinal elasticity. This is necessary in order to mount it on the component 9. The shoulders 6 of the heat sink center the latter on the component 9 at all times. Furthermore, the contact surfaces are positioned, by this centering, relative to the contact surfaces of the heat distributor 8. This applies not only to mounting but also to recentering after external forces have acted on the heat sink in the mounted condition.

If the heat sink 1 has been placed in position but has not yet been mounted via the snap-action connection, then the inner edges 3 of the contact surfaces 2 are initially seated on their own. The outer edges 4 of the contact surfaces 2 are at a slight distance from the heat distributor 8 in this condition. By producing the snap-action connection by means of the tabs 10 of the heat sink, the outer edges 4 of the contact surfaces 2 of the heat sink 1 are also drawn onto the heat distributor 8. A reliable contact for heat dissipation is thus produced.

Further advantages of the heat sink consist in that it can be offered, for example, for mounting in various ways. This can be done, for example, in bar or in coils, the heat sink in this case having to be stamped out immediately before mounting.

A further advantage consists in that the date code of the power SMD-ICs can still be seen and read when the heat sink 1 is located on the component 9. This is possible because of the intricate design of the heat sink 1. In this case, the inscription on the component and the design of the heat sink are matched to one another in such a manner that the inscription comes to rest between two lower meandering curves 11.

A further advantage of the heat sink according to the invention consists in the capability for automatic mounting and removal. The heat sink can also be mounted and removed by hand, that is to say without any tools, because the joining forces are relatively low.

The elasticity of the heat sink 1 is maintained even when it passes through heat treatment processes in the mounted condition. As a result of the relatively low joining forces F, neither the component 9 nor its electrical connecting elements 13 are damaged.

Collisions with the heat sink 1 do not immediately lead to damage to the system, since the heat sink can be deflected, because of its longitudinal elasticity. The solder points, by means of which the component 9 is fixed, for example, on a printed circuit board, are thus stressed to a lesser extent than if the heat sink 1 were bonded or soldered on.

In addition to the longitudinal elasticity in the longitudinal direction 5 of the heat sink 1, the heat sink can also absorb or withstand mechanical influences in directions which run transversely with respect to the longitudinal direction 5, as a result of the lugs 7 which are constructed at the side.

From the above description, it is apparent that the object of the present invention have been achieved. While only certain embodiments have been set forth, alternative embodiments and various modifications will be apparent from the above description to those skilled in the art. These and other alternatives are considered equivalents and within the spirit and scope of the present invention.

We claim:

1. A heat sink for mounting on top of a heat distributor of an electronic component, the heat distributor having a lateral width and a longitudinal length, the heat distributor further having a top surface and an underside, the heat sink comprising:

a body formed from a metal strip, the body comprising a lower portion and an upper portion, the lower portion comprising at least one contact surface for making at least partial contact with the heat distributor of the component, the contact surface being disposed between two laterally spaced apart shoulders disposed on opposing sides of the lower portion and which define a lateral space for accommodating the width of the heat distributor, the lower portion further comprising at least two longitudinally spaced apart lugs disposed on opposing ends of the lower portion and defining a longitudinal space for accommodating the length of the heat distributor, the lower portion further comprising two laterally spaced apart tabs, the tabs being disposed vertically below the shoulders, each tab comprising an upwardly and inwardly directed finger that is spring biased inwardly, each of the fingers sliding down over the top of the heat distributor and engaging the underside thereof when the heat sink is fully mounted onto the electrical component, the upper portion comprising at least two laterally space fins, the fins being biased towards a relaxed position but being resiliently moveable towards each other resulting in a spreading of the shoulders of the lower portion apart to facilitate a mounting of the lower portion of the heat sink onto the heat distributor of the component.

2. The heat sink of claim 1 wherein the metal strip is a strip of sheet brass.

3. The heat sink of claim 4 wherein the lower portion comprises four shoulders including two longitudinally spaced shoulders on each side of the lower portion.

4. The heat sink of claim 1 wherein the lower portion comprises four lugs including two laterally spaced lugs disposed at each end of the lower portion.

5. The heat sink of claim 1 wherein the upper portion comprises three fins including the two laterally spaced fins with a middle fin disposed therebetween.

6. The heat sink of claim 1 wherein each shoulder of the lower portion further comprises a lower tapered portion disposed vertically above the tabs to assist in the centering of the heat sink on the component during the installation thereof.

7. The heat sink of claim 1 wherein the lower portion comprises two contact surfaces, one contact surface disposed on each side of the lower portion.

8. A heat sink for mounting on top of a heat distributor of an electronic component, the heat distributor having a lateral width and a longitudinal length, the heat distributor further having a top surface and an underside, the heat sink comprising:

a body formed from a strip of sheet brass, the body comprising a lower portion and an upper portion, the lower portion comprising two contact surfaces for making contact with the heat distributor of the component, the contact surfaces being disposed between two pairs laterally spaced apart shoulders disposed on opposing sides of the lower portion, each pair of shoulders defining a lateral space for accommodating the width of the heat distributor, each of the shoulders comprising lower tapered ends for assisting in a centering of the lower portion of the heat sink onto the heat distributor, the lower portion further comprising two pairs of longitudinally spaced apart lugs disposed on opposing ends of the lower portion, each pair of lugs defining a longitudinal space for accommodating the length of the heat distributor, the lower portion further comprising two laterally spaced apart tabs, the tabs being disposed vertically below the lower tapered ends of the shoulders, each tab comprising an upwardly and inwardly directed finger that is spring biased inwardly, each of the fingers sliding down over the top of the heat distributor and engaging the underside thereof when the heat sink is fully mounted onto the electrical component, the upper portion comprising at least two laterally spaced fins, the fins being biased towards a relaxed position but being resiliently moveable towards each other resulting in a spreading of the shoulders of the lower portion apart to facilitate a mounting of the lower portion of the heat sink onto the heat distributor of the component.

* * * * *